(12) United States Patent
Kuo

(10) Patent No.: US 8,848,476 B2
(45) Date of Patent: Sep. 30, 2014

(54) FLASH MEMORY DEVICE AND ASSOCIATED CHARGE PUMP CIRCUIT

(75) Inventor: Chung Shan Kuo, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 777 days.

(21) Appl. No.: 13/105,467

(22) Filed: May 11, 2011

(65) Prior Publication Data

US 2012/0287717 A1 Nov. 15, 2012

(51) Int. Cl.
*G11C 5/14* (2006.01)
*H02M 3/07* (2006.01)
*H02M 1/00* (2006.01)

(52) U.S. Cl.
CPC ............... *H02M 3/07* (2013.01); *G11C 5/145* (2013.01); *H02M 2001/0077* (2013.01); *H02M 2001/008* (2013.01); *H02M 2003/077* (2013.01)
USPC .......................................... 365/226; 327/536

(58) Field of Classification Search
CPC ................. G11C 5/145; H02M 3/07; H02M 2001/0077; H02M 2011/008; H02M 2003/077
USPC .......................................... 365/226; 327/536
See application file for complete search history.

(56) References Cited

U.S. PATENT DOCUMENTS

| | | | | |
|---|---|---|---|---|
| 5,732,039 A | * | 3/1998 | Javanifard et al. | 365/226 |
| 6,316,843 B1 | * | 11/2001 | Hsu | 307/29 |
| 6,628,555 B2 | * | 9/2003 | Kondo et al. | 365/189.09 |
| 8,233,328 B2 | * | 7/2012 | Izumi et al. | 365/185.23 |
| 8,699,247 B2 | * | 4/2014 | Nguyen et al. | 363/59 |
| 2006/0291310 A1 | * | 12/2006 | Kang | 365/203 |

* cited by examiner

*Primary Examiner* — Vanthu Nguyen
(74) *Attorney, Agent, or Firm* — Juan Carlos A. Marquez; Bacon & Thomas PLLC

(57) ABSTRACT

A charge pump circuit comprises a first booster set, a second booster group, and a detecting circuit. The first booster set receives a supply voltage and generates a first output voltage. The detecting circuit generates a detecting signal depending on the voltage level of the first output voltage. The second booster group receives the supply voltage and generates the first output voltage or a second output voltage according to the detecting signal. The second booster group is composed of a plurality of booster sets connected in parallel, wherein each booster set comprises a plurality of charge pump stages and a plurality of switch units. The number of serially-connected charge pump stages of each booster set in the second booster group is controlled by the plurality of switch units according to the stable voltage levels of the first and second output voltages.

10 Claims, 7 Drawing Sheets

FLASH MEMORY DEVICE AND ASSOCIATED CHARGE PUMP CIRCUIT

BACKGROUND OF THE INVENTION

1. Field of the Invention

The present invention relates to a flash memory device and associated charge pump circuit.

2. Description of the Related Art

Semiconductor memory devices are devices in which data can be stored and from which stored data can be retrieved. Semiconductor memory devices can be classified into random access memory (RAM) and read only memory (ROM). RAM is a volatile memory that needs power supply to retain data. ROM is a nonvolatile memory that can retain data even when power is removed. Examples of RAM are a dynamic RAM (DRAM) and a static RAM (SRAM). Examples of ROM are a programmable ROM (PROM), an erasable PROM (EPROM), an electrically EPROM (EEPROM), and a flash memory.

Both ROM and RAM are high density, being able to store high amounts of data in relatively small spaces. However, both ROM and RAM typically consume large amounts of power. To address this issue, a solution for low-power, high-density, easily programmable non-volatile memory is flash memory. Flash memory is ideal for portable devices that require large storage capacity. FIG. 1 shows a block diagram of a conventional flash memory device 10. The flash memory device 10 comprises a row decoder 12, a column decoder 14, and a flash memory cell array 16. The row decoder 12 and the column decoder 14 function by applying a word line voltage and a bit line voltage, respectively, to a given cell of the memory cell array 16.

Because the flash memory device 10 receives a single supply voltage VCC and the word lines and bit lines of the memory cell array 16 require different driving voltages in operation, multiple voltage boosters or, more commonly, charge pumps are required to provide voltages greater than the supply voltage VCC. Referring to FIG. 1, a charge pump 18 outputs a boosting voltage VPP to the row decoder 12 and a charge pump 19 outputs a boosting voltage VDD to the column decoder 14. The charge pumps 18 and 19 are generally comprised of a plurality of booster stages cascaded between the input and the output of the charge pump, wherein each booster stage contains a boost capacitor with a high capacitance. The addition of the charge pumps 18 and 19 result in a significant increase in chip area and power consumption. Based on the above, there is a need to provide an improved flash memory device comprising fewer charge pump circuits.

SUMMARY OF THE INVENTION

An aspect of the present invention is to provide a charge pump circuit.

According to one embodiment of the present invention, the charge pump circuit comprises a first booster set, a second booster group, and a detecting circuit. The first booster set receives a supply voltage and generates a first output voltage, wherein the first booster set is composed of a plurality of charge pump stages connected in series. The detecting circuit generates a detecting signal depending on the voltage level of the first output voltage. The second booster group receives the supply voltage and generates the first output voltage or a second output voltage according to the detecting signal, wherein the second booster group is composed of a plurality of booster sets connected in parallel, and each booster set comprises a plurality of charge pump stages and a plurality of switch units. The stable voltage level of the first output voltage is larger than that of the second output voltage. The number of charge pump stages in the first booster set is the same as the number of charge pump stages of each booster set in the second booster group. In particular, the number of serially-connected charge pump stages of each booster set in the second booster group is controlled by the plurality of switch units based on the stable voltage levels of the first and second output voltages.

Another aspect of the present invention is to provide a flash memory device.

According to one embodiment of the present invention, the flash memory device comprises a row decoder, a column decoder, a flash memory cell array, and a charge pump circuit. The row decoder provides word line voltages to the memory cell array, and the column decoder provides bit line voltages to the memory cell array. The charge pump circuit receives a supply voltage and provides a first output voltage to the row decoder and provides a second output voltage to the column decoder. The charge pump circuit comprises a first booster set, a second booster group, and a detecting circuit. The first booster set receives a supply voltage and generates a first output voltage, wherein the first booster set is composed of a plurality of charge pump stages connected in series. The detecting circuit generates a detecting signal depending on the voltage level of the first output voltage. The second booster group receives the supply voltage and generates the first output voltage or a second output voltage according to the detecting signal, wherein the second booster group is composed of a plurality of booster sets connected in parallel, and each booster set comprises a plurality of charge pump stages and a plurality of switch units. The stable voltage level of the first output voltage is greater than the second output voltage. The number of charge pump stages in the first booster set is the same as the number of charge pump stages of each booster set in the second booster group. In particular, the number of serially-connected charge pump stages of each booster set in the second booster group is controlled by the plurality of switch units according to the stable voltage levels of the first and second output voltages.

BRIEF DESCRIPTION OF THE DRAWINGS

The invention will be described according to the appended drawings in which.

DETAILED DESCRIPTION OF THE INVENTION

Figure 1:
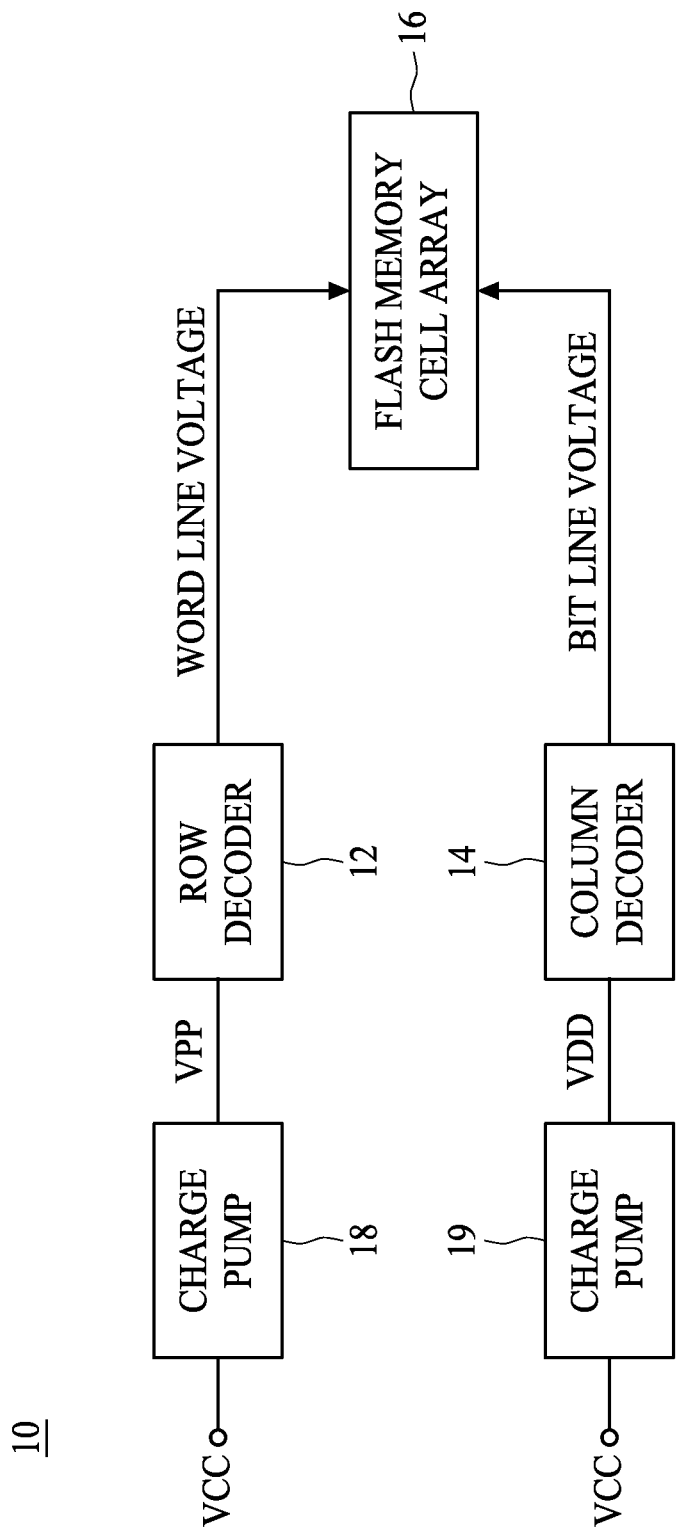
FIG. 1 shows a block diagram of a conventional flash memory device.
Figure 2:
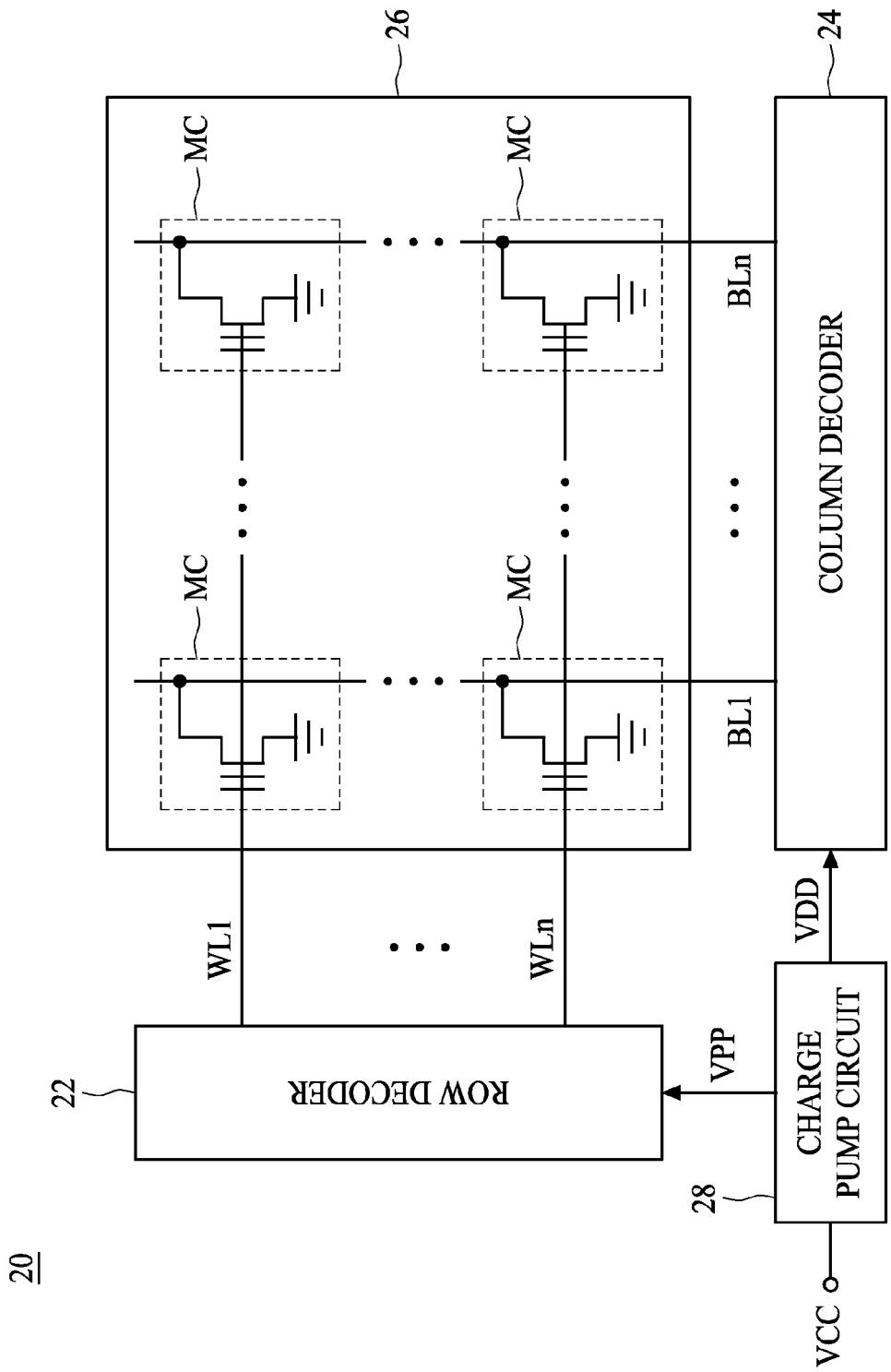
FIG. 2 shows a block diagram of a flash memory device according to one embodiment of the present invention.

FIG. 2 shows a block diagram of a flash memory device 20 according to one embodiment of the present invention. The flash memory device 20 comprises a row decoder 22, a column decoder 24, a flash memory cell array 26, and a charge pump circuit 28. Referring to FIG. 2, the flash memory cell array 26 comprises a plurality of memory cells MC arranged in rows and columns. The word lines WL1-WLn connect first terminals of the memory cells MC arranged in the same row, and the bit lines BL1-BLn connect second terminals of the memory cells MC arranged in the same column. The row decoder 22 connects to the memory cell array 26 to provide word line voltages to the memory cell array 26, and the column decoder 24 connects to the memory cell array 26 to provide bit line voltages to the memory cell array 26.

Figure 3:
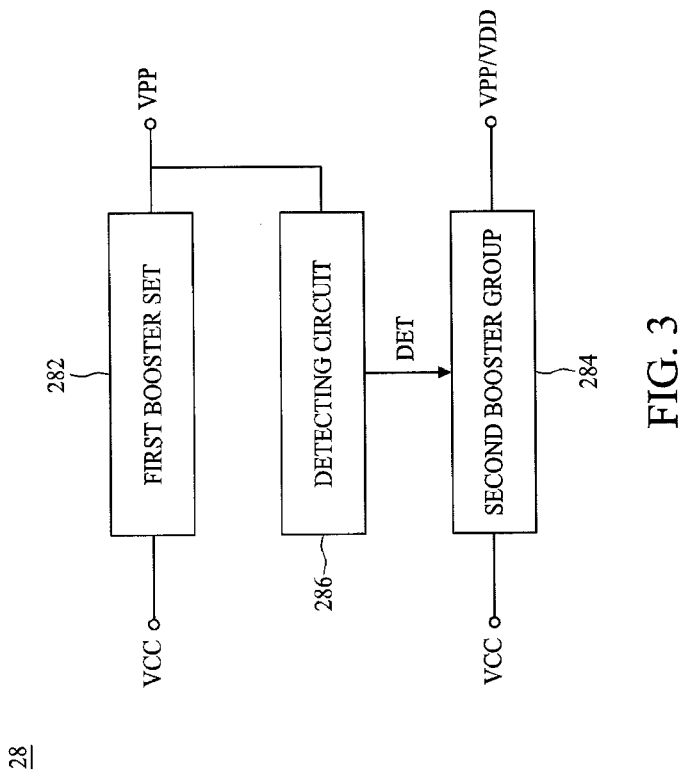
FIG. 3 shows a block diagram of the charge pump circuit according to one embodiment of the present invention.

Referring to FIG. 2, the flash memory device 20 receives a single supply voltage VCC. However, the word lines WL1-WLn and bit lines BL1-BLn require different driving voltages for different operations. For example, a boosting voltage VPP of about 9V is required to drive the word lines WL1-WLn for write operations, and a boosting voltage VDD of about 4.5-5V is required to drive the bit lines BL1-BLn. Therefore, the charge pump circuit 28 is designed to provide the boosting voltage VPP to the row decoder 22 and provide the boosting voltage VDD to the column decoder 24. FIG. 3 shows a block diagram of the charge pump circuit 28 according to one embodiment of the present invention. Referring to FIG. 3, the charge pump circuit 28 comprises a first booster set 282, a second booster group 284, and a detecting circuit 286. The first booster set 282 receives the supply voltage VCC and generates the boosting voltage VPP to the row decoder 22. The detecting circuit 286 generates a detecting signal DET based on the voltage level of the boosting voltage VPP. The second booster set 284 receives the supply voltage VCC and generates the boosting voltage VPP to the row decoder 22 or generates the boosting voltage VDD to the column decoder 24 according to the detecting signal.

Figure 4:
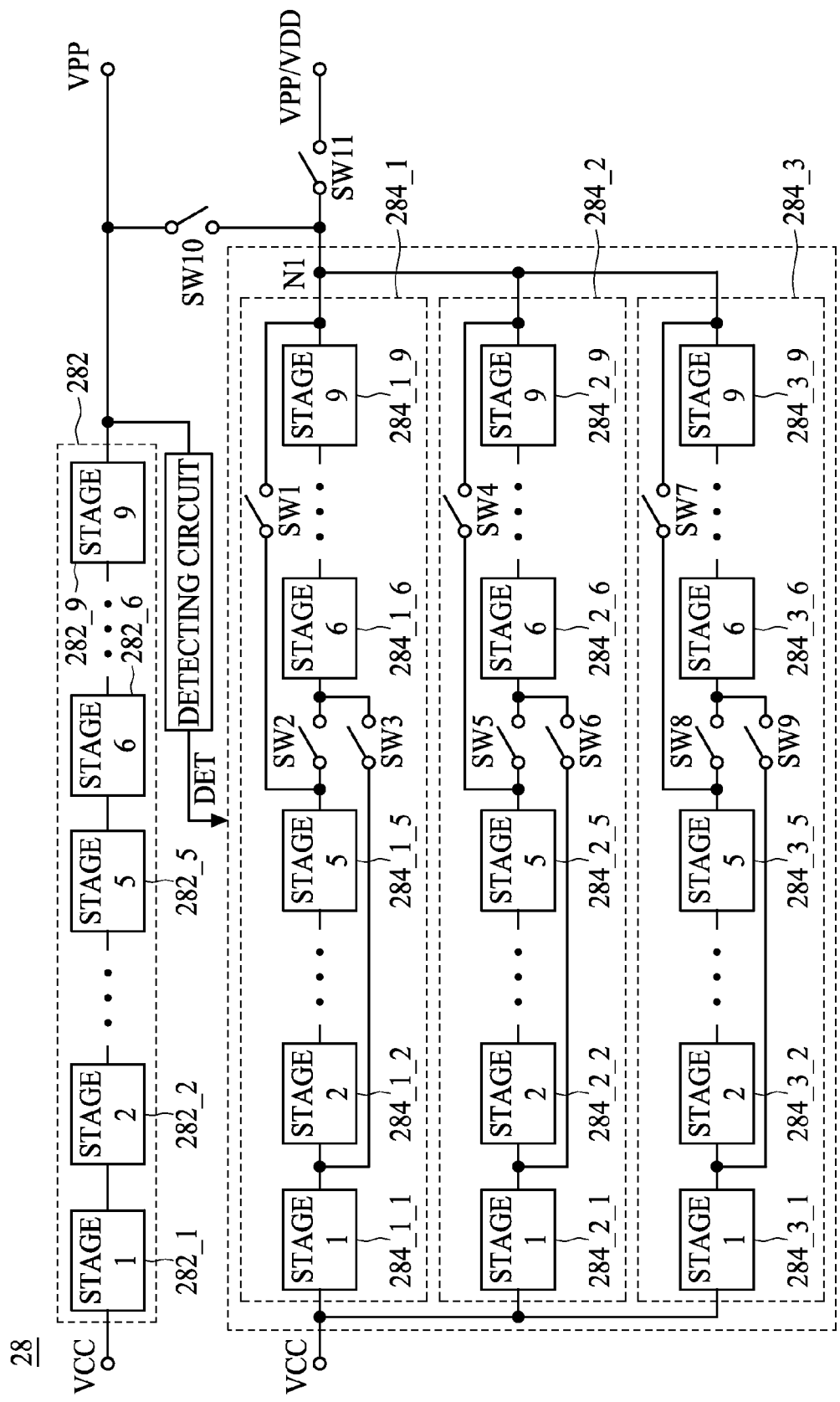
FIG. 4 is a detail block diagram of the charge pump circuit according to one embodiment of the present invention.

FIG. 4 is a detail block diagram of the charge pump circuit 28 according to one embodiment of the present invention. Referring to FIG. 4, the first booster set 282 is composed of a plurality of charge pump stages 282_1, to 282_9 connected in series. Each charge pump stage is used to provide an amplified voltage at an output node. In order to provide the boosting voltage VPP that is nine times that of the supplied voltage VCC in this embodiment, nine serially-connected charge pump stages 282_1, to 282_9 are positioned between the input node VCC and the row decoder 22.

In addition, the second booster group 284 is composed of a plurality of booster sets 284_1, 284_2, and 284_3 connected in parallel, wherein each booster set comprises a plurality of charge pump stages and a plurality of switches. The number of booster sets in the second booster group 284 is determined according to the required current supply to the bit lines of the flash memory cell array 26. Referring to FIG. 4, the booster set 284_1 comprises nine charge pump stages 284_1_1 to 284_1_9 connected between the input node VCC and the output node N1, the booster set 284_2 comprises nine charge pump stages 284_2_1 to 284_2_9 connected between the input node VCC and the output node N1, and the booster set 284_3 comprises nine charge pump stages 284_3_1 to 284_3_9 connected between the input node VCC and the output node N1.

The charge pump stages of each booster set in the second booster group 284 can be connected in series or parallel depending on the status of the corresponding switches. For example, the charge pump stages 284_1_1 to 284_1_9 of the booster set 284_1 are connected in series when the switch SW2 turns on and the switches SW1 and SW3 turn off. Alternatively, the charge pump stages 284_1_2 to 284_1_5 and the charge pump stages 284_1_6 to 284_1_9 of the booster set 284_1 are connected in parallel when the switch SW2 turns off and the switches SW1 and SW3 turn on. The status of each of the switches SW1 to SW9 is determined according to the voltage levels of the boosting voltages VPP and VDD.

Figure 5:
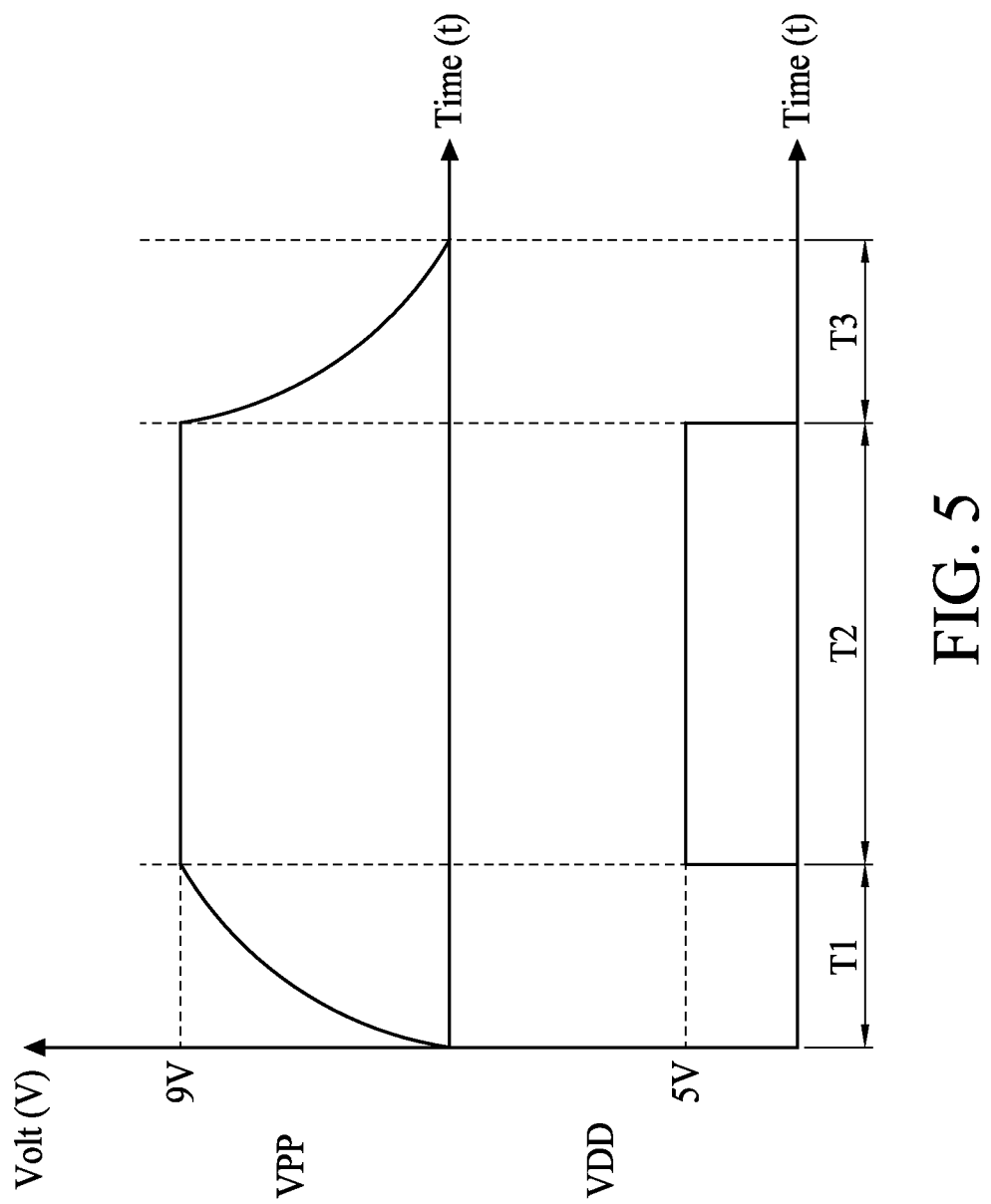
FIG. 5 shows the waveforms of the boosting voltages VPP and VDD according to one embodiment of the present invention.

FIG. 5 shows the waveforms of the boosting voltages VPP and VDD according to one embodiment of the present invention. Referring to FIG. 5, the voltage VPP rises during the time interval T1, remains at a substantially constant value (around 9V in this embodiment) during the time interval T2, and falls during the time interval T3. Based on the voltage level of the voltage VPP, the detecting circuit 286 generates the detecting signal DET. When the voltage level of the voltage VPP is below a threshold value, i.e., 9V in this case, the detecting signal DET has a logic low level and thus the switches SW2, SW5, and SW8 turn on and other switches turn off.

Figure 6:
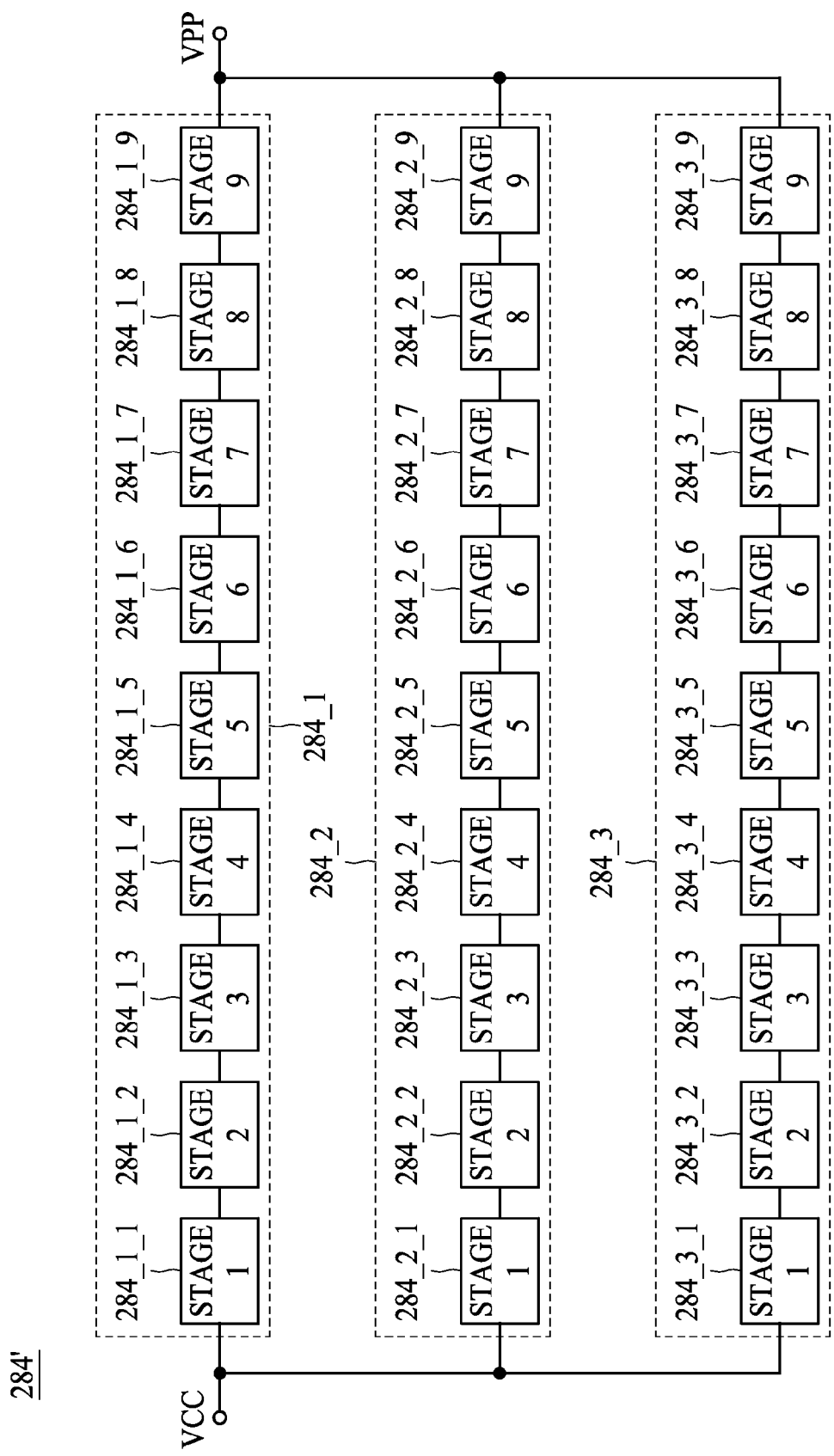
FIG. 6 is a diagram of an exemplary configuration of the second booster group during the time interval T1.

FIG. 6 is a diagram of an exemplary configuration of the second booster group 284 during the time interval T1. Referring to FIG. 6, the charge pump stages of the booster sets 284_1, 284_2, and 284_3 in the second booster group 284 are connected in series, and the voltage VPP is nine times the supplied voltage VCC.

Referring now to FIG. 4, the charge pump circuit 28 further comprises switches SW10 and SW11. The switch SW10 is connected between an output of the first booster set 282 and an output of the second booster group 284, and the switch SW11 is connected between the output of the second booster group 284 and the inputs of the row decoder 22 and the column decoder 24. When the voltage level of the voltage VPP is less than the threshold value, the switch SW11 turns off and the switch SW10 turns on. Therefore, all the current from the first booster set 282 and the second booster group 284 is supplied to the row decoder 22, and the voltage level of the voltage VPP can increase rapidly.

Figure 7:
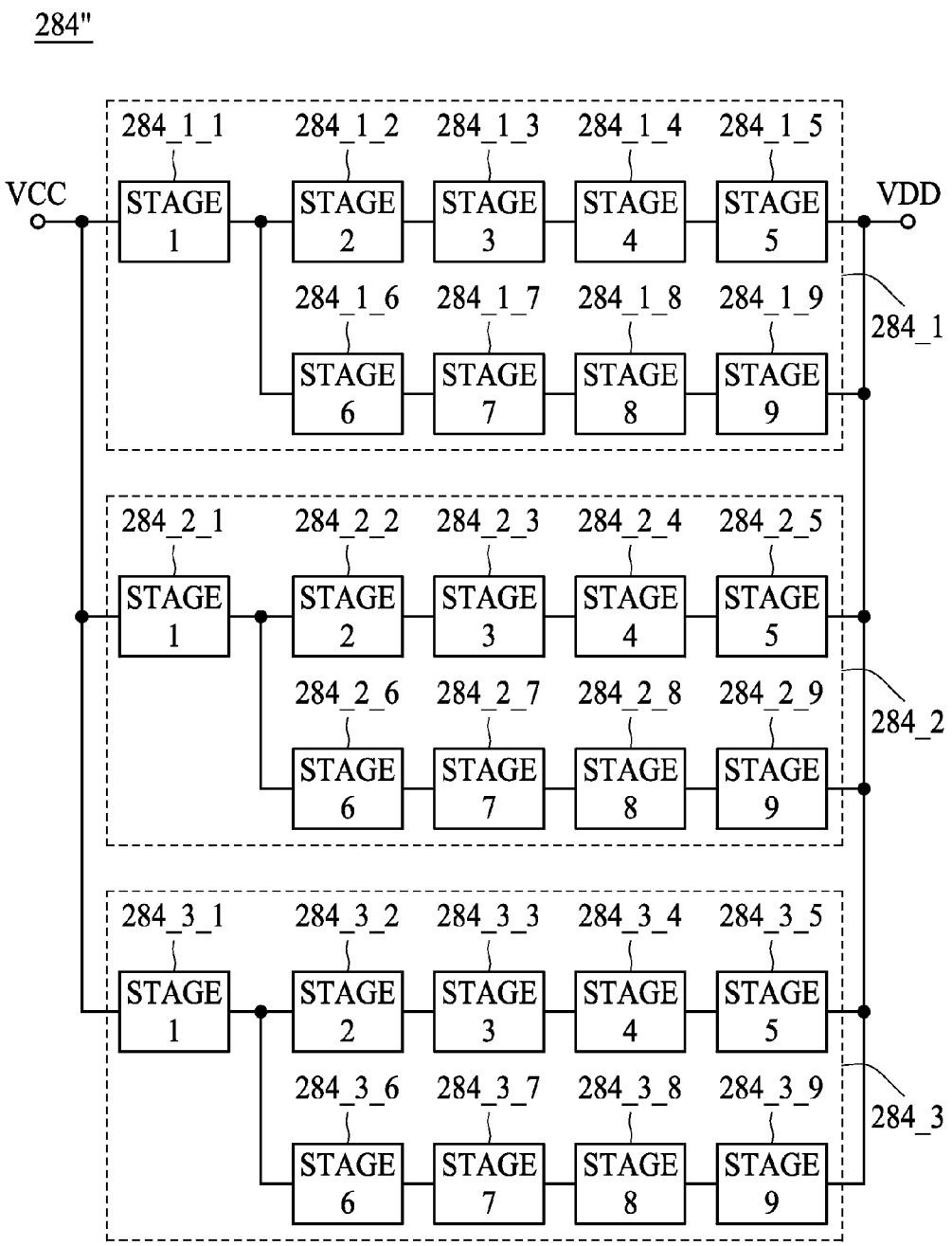
FIG. 7 is a diagram of an exemplary configuration of the second booster group during the time interval T2.

When the voltage level of the voltage VPP is greater than the threshold value, the switch SW10 turns off and the switch SW11 turns on. In this case, the configuration of the second booster group 284 is altered so that the second booster group 284 can provide the boosting voltage VDD to the column decoder 24 through the switch SW11. FIG. 7 is a diagram of an exemplary configuration of the second booster group 284 during the time interval T2. Referring to FIG. 7, the charge pump stages from 284_1_2 to 284_1_5 and the charge pump stages from 284_1_6 to 284_1_9 of the booster set 284_1 are connected in parallel, the charge pump stages from 284_2_2 to 284_2_5 and the charge pump stages from 284_2_6 to 284_2_9 of the booster set 284_2 are connected in parallel, and the charge pump stages from 284_3_2 to 284_3_5 and the charge pump stages from 284_3_6 to 284_3_9 of the booster set 284_3 are connected in parallel. Therefore, each booster set has five serially-connected charge pump stages and a 5V DC voltage is supplied to the column decoder 24. According to the embodiment of the present invention, the number of serially-connected charge pump stages of each booster set in the second booster group 284 is controlled by the switches 1 to 9, so that the boosting voltage supplied by the second booster group 284 can be varied. Therefore, fewer charge pump circuits are required and the chip area can be reduced according to the present invention.

The above-described embodiments of the present invention are intended to be illustrative only. Numerous alternative embodiments may be devised by those skilled in the art without departing from the scope of the following claims.

What is claimed is:

1. A charge pump circuit, comprising:
a first booster set for receiving a supply voltage and generating a first output voltage, wherein the first booster set comprises a plurality of charge pump stages connected in series;
a detecting circuit for generating a detecting signal depending on the voltage level of the first output voltage; and
a second booster group for receiving the supply voltage and generating the first output voltage or a second output voltage according to the detecting signal, wherein the second booster group comprises a plurality of booster sets connected in parallel, and each booster set comprises a plurality of charge pump stages and a plurality of switch units;
wherein the stable voltage level of the first output voltage is greater than the second output voltage;
the number of charge pump stages in the first booster set is the same as the number of charge pump stages of each booster set in the second booster group; and
the number of serially-connected charge pump stages of each booster set in the second booster group is controlled by the plurality of switch units according to the stable voltage levels of the first and second output voltages.

2. The charge pump circuit of claim 1, further comprising:
a first switch unit connecting an output of the first booster set to an output of the second booster group according to the detecting signal; and
a second switch unit connecting the output of the second booster group to a first node according to the detecting signal.

3. The charge pump circuit of claim 2, wherein the number of booster sets in the second booster group is determined according to the required current of a load connected to the first node.

4. The charge pump circuit of claim 1, wherein the second booster group generates the first output voltage when the voltage level of the first output voltage is less than a threshold value, and the second booster group also generates the second output voltage when the voltage level of the first output voltage is greater than a threshold value.

5. The charge pump circuit of claim 4, wherein the charge pump stages of each booster set in the second booster group are connected in series when the voltage level of the first output voltage is less than the threshold value, and a portion of the charge pump stages of each booster set in the second booster group are connected in parallel when the voltage level of the first output voltage is greater than the threshold value.

6. A flash memory device, comprising:
a flash memory cell array;
a row decoder for providing word line voltages to the memory cell array;
a column decoder for providing bit line voltages to the memory cell array; and
a charge pump circuit for receiving a supply voltage and providing a first output voltage to the row decoder and providing a second output voltage to the column decoder, the charge pump circuit comprising:
a first booster set for receiving a supply voltage and generating a first output voltage, wherein the first booster set comprises a plurality of charge pump stages connected in series;
a detecting circuit for generating a detecting signal depending on the voltage level of the first output voltage; and
a second booster group for receiving the supply voltage and generating the first output voltage or a second output voltage according to the detecting signal, wherein the second booster group comprises a plurality of booster sets connected in parallel, and each booster set comprises a plurality of charge pump stages and a plurality of switch units;
wherein the stable voltage level of the first output voltage is greater than the second output voltage;
the number of charge pump stages in the first booster set is the same as the number of charge pump stages of each booster set in the second booster group; and
the number of serially-connected charge pump stages of each booster set in the second booster group is controlled by the plurality of switch units according to the stable voltage levels of the first and second output voltages.

7. The flash memory device of claim 6, further comprising:
a first switch unit connecting an output of the first booster set to an output of the second booster group according to the detecting signal; and
a second switch unit connecting the output of the second booster group to the column decoder according to the detecting signal.

8. The flash memory device of claim 6, wherein the number of booster sets in the second booster group is determined according to the required current supply to the bit lines of the flash memory cell array.

9. The flash memory device of claim 6, wherein the second booster group generates the first output voltage when the voltage level of the first output voltage is less than a threshold value, and the second booster group generates the second output voltage when the voltage level of the first output voltage is greater than a threshold value.

10. The flash memory device of claim 9, wherein the charge pump stages of each booster set in the second booster group are connected in series when the voltage level of the first output voltage is less than the threshold value, and a portion of the charge pump stages of each booster set in the second booster group are connected in parallel when the voltage level of the first output voltage is greater than the threshold value.

* * * * *